(12) United States Patent
Eifuku et al.

(10) Patent No.: US 10,080,298 B2
(45) Date of Patent: Sep. 18, 2018

(54) CIRCUIT BOARD INTERCONNECTION STRUCTURE AND CIRCUIT BOARD INTERCONNECTION METHOD

(71) Applicant: PANASONIC CORPORATION, Osaka (JP)

(72) Inventors: Hideki Eifuku, Osaka (JP); Koji Motomura, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 65 days.

(21) Appl. No.: 14/257,546

(22) Filed: Apr. 21, 2014

(65) Prior Publication Data

US 2014/0318837 A1     Oct. 30, 2014

(30) Foreign Application Priority Data

Apr. 26, 2013   (JP) ................. 2013-093433

(51) Int. Cl.
*H05K 1/11*     (2006.01)
*H05K 3/36*     (2006.01)
(Continued)

(52) U.S. Cl.
CPC .............. *H05K 3/361* (2013.01); *H05K 1/03* (2013.01); *H05K 1/09* (2013.01); *H05K 1/11* (2013.01);
(Continued)

(58) Field of Classification Search
CPC . H05K 2201/0326; H05K 2201/10136; H05K 1/03; H05K 1/09; H05K 1/11;
(Continued)

(56) References Cited

U.S. PATENT DOCUMENTS 5,965,064 A * 10/1999 Yamada ................. C09J 9/02
174/259
6,000,127 A * 12/1999 Eifuku .............. H01L 21/563
257/E21.503
(Continued)

FOREIGN PATENT DOCUMENTS

CN          1103803 C      3/2003
JP       2007-149815 A     6/2007

OTHER PUBLICATIONS

Chinese Office Action and Search Report issued corresponding Chinese Patent Application No. 201410172123.3, dated Jul. 26, 2017; with partial English translation.

*Primary Examiner* — Ishwarbhai B Patel
*Assistant Examiner* — Paresh Paghadal
(74) *Attorney, Agent, or Firm* — McDermott Will & Emery LLP (57) ABSTRACT

Provided is a circuit board interconnection structure including: a first circuit board including a first substrate and a first electrode formed on a surface of the first substrate; a second circuit board including a second substrate and a second electrode formed on a surface of the second substrate; one or more joining portions formed of a metal-containing conductive material for joining the first and second electrodes, interposed between the first and second electrodes; and a reinforcing resin portion for reinforcing the one or more joining portions. The first electrode is a transparent electrode including a metal oxide film. A first abutting portion of the joining portion abutting the first electrode, is formed by adhesional wetting of the first electrode with the conductive material.

10 Claims, 6 Drawing Sheets

(51) Int. Cl.
*H05K 1/09* (2006.01)
*H05K 1/03* (2006.01)
*H05K 3/32* (2006.01)

(52) U.S. Cl.
CPC ..... *H05K 3/323* (2013.01); *H05K 2201/0326* (2013.01); *H05K 2201/10136* (2013.01); *H05K 2201/10234* (2013.01)

(58) Field of Classification Search
CPC .... H05K 1/0298; H05K 1/4614; H05K 3/361; H05K 3/323; H05K 2201/10234
See application file for complete search history.

(56) References Cited

U.S. PATENT DOCUMENTS

| | | | | |
|---|---|---|---|---|
| 6,034,331 | A * | 3/2000 | Tsukagoshi | H01L 24/29 174/250 |
| 6,528,343 | B1 * | 3/2003 | Kikuchi | H01L 23/3114 257/734 |
| 6,583,834 | B1 * | 6/2003 | Uchiyama | G02F 1/13452 257/E21.514 |
| 6,777,071 | B2 * | 8/2004 | Cobbley | C09J 5/00 428/323 |
| 7,777,335 | B2 * | 8/2010 | Arifuku | C09J 4/06 252/512 |
| 8,016,181 | B2 * | 9/2011 | Saimen | G02F 1/13452 228/179.1 |
| 2003/0080092 | A1 * | 5/2003 | Arvin | C23F 1/44 216/83 |
| 2003/0203668 | A1 * | 10/2003 | Cobbley | C09J 5/00 439/323 |
| 2005/0008873 | A1 * | 1/2005 | Noro | B32B 27/08 428/423.1 |
| 2006/0232740 | A1 * | 10/2006 | Shigemura | G02F 1/1339 349/153 |
| 2008/0157328 | A1 * | 7/2008 | Kawata | H01L 21/561 257/686 |
| 2009/0047534 | A1 * | 2/2009 | Sakai | B23K 35/262 428/539.5 |
| 2009/0075025 | A1 | 3/2009 | Ozono et al. | |
| 2009/0161328 | A1 * | 6/2009 | Sakai | B23K 35/365 361/760 |
| 2009/0229123 | A1 * | 9/2009 | Sakai | H01L 24/29 29/854 |
| 2009/0291314 | A1 * | 11/2009 | Sakai | H01L 24/81 428/457 |
| 2010/0006625 | A1 * | 1/2010 | Eom | B23K 3/0623 228/164 |
| 2010/0212937 | A1 * | 8/2010 | Kondo | H05K 3/4617 174/254 |
| 2011/0063805 | A1 * | 3/2011 | Kim | H01L 25/0657 361/743 |
| 2011/0279766 | A1 * | 11/2011 | Kitoh | G02F 1/1345 349/152 |
| 2012/0138868 | A1 * | 6/2012 | Arifuku | B82Y 10/00 252/510 |
| 2013/0228916 | A1 * | 9/2013 | Mawatari | H01L 24/81 257/737 |

* cited by examiner

Prior Art

FIG.11B

Prior Art

CIRCUIT BOARD INTERCONNECTION STRUCTURE AND CIRCUIT BOARD INTERCONNECTION METHOD

FIELD OF THE INVENTION

The present invention relates to a circuit board interconnection structure and a circuit board interconnection method. In the structure and the method, electrodes provided on a surface of a circuit board are directly joined, without use of leads, to electrodes provided on a surface of another circuit board, thereby to create an interconnection between the circuit boards.

BACKGROUND OF THE INVENTION

Conventionally, a circuit board interconnection structure, in which electrodes provided on a surface of a circuit board are directly joined to electrodes provided on a surface of another circuit board, is known to use an anisotropic conductive film (ACF). An ACF is a mixture containing a reinforcing resin including thermoset resin and conductive particles dispersed uniformly in the reinforcing resin, that is molded into a film. Use of an ACF enables easier interconnection between fine-pitch boards.

An ACF is commonly used in FOG (film-on-glass) applications in particular, in which a FPC (flexible printed circuit) with driver ICs and other components mounted thereon is connected to a circuit board for an LCD (liquid crystal display) panel comprising a glass substrate and transparent electrodes.

However, in a circuit board interconnection structure which uses an ACF, there is increased electrical resistance and less reliable connection, since electricity is conducted between the electrodes by mere contact between the conductive particles and the electrodes. Therefore, a proposal has been made to use solder particles as the conductive particles, so that the electrodes are connected, not only by mere contact between the conductive particles and the electrodes, but also by soldering enabled between the electrodes (c.f., Japanese Laid-Open Patent Application No. 2007-149815).

SUMMARY OF THE INVENTION

However, in an LCD panel for example, the transparent electrodes are thin films of ITO (tin-doped indium oxide) (hereafter referred to as transparent conductive films or ITO electrodes) for example. When electrodes on another module (e.g., a driver circuit board having a FPC and driver ICs mounted thereon) are soldered to such ITO electrodes, the ITO electrodes may corrode due to being alloyed with the solder material, causing poor electrical continuity between the electrodes. That is, the ITO electrodes do not have a thickness as that of typical electrodes, and are formed directly on the glass substrate; and therefore, their corrosion due to being alloyed with the solder material would easily impair their conductivity.

Therefore, an object of the present invention is to provide a circuit board interconnection structure and a circuit board interconnection method, both capable of creating a highly reliable connection between a circuit board having thereon transparent electrodes including a thin metal oxide film, and another circuit board.

One aspect of the present invention relates to a circuit board interconnection structure comprising:

a first circuit board including a first substrate and a first electrode formed on a surface of the first substrate;

a second circuit board including a second substrate and a second electrode formed on a surface of the second substrate;

one or more joining portions formed of a metal-containing conductive material for joining the first and second electrodes, interposed between the first and second electrodes; and a reinforcing resin portion for reinforcing the one or more joining portions, the first electrode being a transparent electrode including a metal oxide film, and a first abutting portion of the one or more joining portions abutting the first electrode, being formed by adhesional wetting of the first electrode with the conductive material.

Another aspect of the present invention relates to a circuit board interconnection method comprising:

a step (i) of preparing a first circuit board including a first substrate and a first electrode formed on a surface of the first substrate;

a step (ii) of preparing a second circuit board including a second substrate and a second electrode formed on a surface of the second substrate;

a step (iii) of providing an interconnecting material mixture including metal-containing conductive particles and a thermoset resin, to come between the first and second electrodes; and a step (iv) of heating the interconnecting material mixture to a predetermined temperature Ta at which the thermoset resin thermally cures and the conductive particles wet the first electrode, adhesionally but not immersionally; and pressurizing the interconnecting material mixture between the first and second electrodes, thereby to interconnect the first and second electrodes via one or more joining portions formed of a metal-containing conductive material formed from the conductive particle, and to form a resin reinforcing portion for reinforcing the one or more joining portions from the thermoset resin.

According to the present invention, a circuit board having thereon transparent electrode(s) including a metal oxide film, and another circuit board, can be connected with high reliability.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENTS

The present invention relates to a circuit board interconnection structure comprising:

a first circuit board including a first substrate and a first electrode formed on a surface of the first substrate;

a second circuit board including a second substrate and a second electrode formed on a surface of the second substrate;

one or more joining portions formed of a metal-containing conductive material for joining the first and second electrodes, interposed between the first and second electrodes; and a reinforcing resin portion for reinforcing the joining portions.

Here, the first electrode is a transparent electrode including a metal oxide film. Regarding the joining portion, a first abutting portion thereof which abuts the first electrode, is formed by adhesional wetting of the first electrode with the conductive material.

A circuit board interconnection method of the present invention, for realizing the foregoing structure, comprises:

a step (i) of preparing a first circuit board including a first substrate and a first electrode formed on a surface of the first substrate;

a step (ii) of preparing a second circuit board including a second substrate and a second electrode formed on a surface of the second substrate;

a step (iii) of providing an interconnecting material mixture including metal-containing conductive particles and a thermoset resin, to come between the first and second electrodes; and a step (iv) of heating the interconnecting material mixture to a predetermined temperature Ta at which the thermoset resin thermally cures and the conductive particles wet the first electrode, adhesionally but not immersionally; and pressurizing the interconnecting material mixture between the first and second electrodes, thereby to interconnect the first and second electrodes via one or more joining portions formed of a metal-containing conductive material formed from the conductive particle, and to form a resin reinforcing portion for reinforcing the one or more joining portions from the thermoset resin.

The temperature Ta may be a melting point of the conductive particles or a higher temperature, or a temperature lower than the melting point; but is preferably a temperature lower than the melting point, since it becomes easier to form the joining portion by the conductive particle adhesionally but not immersionally wetting the first electrode. When the melting point is of a certain range, the temperature Ta is preferably lower than the lowest temperature of that range.

Figure 10A:
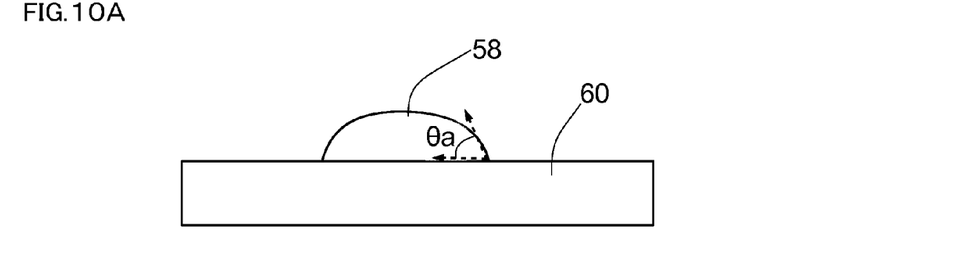

Immersional wetting is when a contact angle θa between the conductive material and the electrode surface is 0°<θa≤90° (see FIG. 10A). Adhesional wetting is when the contact angle θa is 90°<θa (see FIG. 10B). Typically, a force with which a fluid attaches to a matter, is said to be a total of forces caused by, for example, a Van der Waals force, an electrostatic force, a liquid cross-linking force, and a solid cross-linking force. In the circuit board interconnection structure of the present invention, the above-described first abutting portion of the joining portion is formed by adhesional wetting of the first electrode with the conductive material originating from the conductive particle in the interconnecting material mixture. Thus, the conductive material and the first electrode can be joined in a manner intermediate between "joining" by immersional wetting by the conventional ESC (Epoxy-Encapsulated Solder Connection) method) and "contact" in the case of using an ACF. The contact angle θa between the joining portion and the first electrode is further preferably 95° to 155°. When there are two or more of the joining portions between one first electrode and one second electrode, it will suffice if the first abutting portion of at least one of the joining portions is formed by adhesional wetting of the first electrode with the conductive material.

Figure 11A:
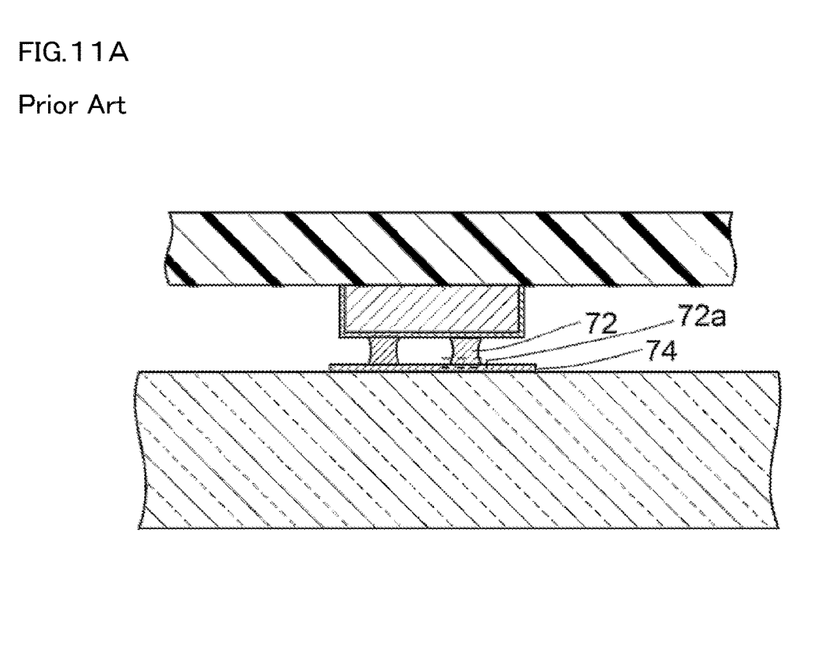

As described above, in the circuit board interconnection structure, the first abutting portion of the joining portion, which abuts the first electrode, i.e., the transparent electrode including the thin metal oxide film, is formed by adhesional wetting of the first electrode with the conductive material. This enables prevention of formation of an alloy between the thin metal oxide film and the metal in the conductive material at the first abutting portion. In contrast, as illustrated in FIG. 11A (Prior Art), when the first abutting portion 72a of the joining portion 72 is formed by immersional wetting of the first electrode 74, e.g., an ITO electrode, with the conductive material, the first abutting portion 72a is mainly formed of an alloy containing the metal in the first electrode 74 and the metal in the conductive material. Such an alloy has a lower melting point than that of the thin metal oxide film forming the first electrode 74, and therefore easily melts, for example, when the circuit board interconnection structure is further heated in a later process, or when a comparatively large amount of heat is generated in an electronic equipment (as the liquid crystal display, for example) including the circuit board interconnection structure.

When the alloy melts, the metal component from the first electrode 74 additionally flows into the molten alloy, causing corrosion of the first electrode 74 to progress. As a result, the portion of the first electrode 74 that had been in contact with the joining portion 72 is lost (see FIG. 11B); and electrical continuity between the first electrode and the joining portion is cut off. This causes poor electrical continuity between the first and second electrodes.

According to the present invention, corrosion of the thin metal oxide film is prevented, due to prevention of formation of the above-described alloy at the first abutting portion of the joining portion. Thus, poor electrical continuity between the first and second electrodes can be prevented from occurring. Furthermore, according to the circuit board interconnection method of the present invention, the joining portion is formed, not by just heating the conductive particles, but by carrying out thermocompression bonding which includes a process of pressurizing the conductive particles between the first and second electrodes. Thus, a cross-sectional area of the first abutting portion formed by adhesional wetting can be made larger than when the conductive particles are just heated. Therefore, electrical resistance between the first and second electrodes can be made smaller. This results in realization of a good connection between the first and second electrodes, and also, a more reliable connection between the circuit boards. Here, a ratio of a largest cross-sectional area $S_1$ of the joining portion to the cross-sectional area $S_2$ of the first abutting portion ($S_1/S_2$) is preferably 1.1 to 4. Note that the cross-sectional area of the first abutting portion is, for example, a sectional area created when the joining portion is cut at a position where the joining portion and the surface of the first electrode come in contact with each other.

Thickness of the metal oxide film is preferably 0.05 µm to 0.4 µm, and further preferably 0.1 µm to 0.3 µm. The metal oxide film exemplarily comprises an oxide containing indium and tin. That is, the first electrode is exemplarily a transparent conductive film formed of ITO (tin-doped indium oxide), and in that case, the first circuit board preferably includes a transparent substrate (e.g., glass substrate) as the first substrate. The thin metal oxide film, i.e., the ITO electrode, is preferably formed directly on the surface of the first substrate, i.e., the glass substrate. Alternatively, the transparent conductive film may be a thin metal oxide film comprising zinc oxide (ZnO) and gallium (Ga) added thereto (GZO film), or a thin metal oxide film comprising zinc oxide (ZnO) and aluminum (Al) added thereto (AZO film). Due to using either of these thin metal oxide films as the transparent conductive film, it becomes easier to reduce the production cost for an electronic device.

The conductive material originating from the conductive particle preferably includes at least one selected from the group consisting of indium, tin, gold, and silver. Since indium, tin, gold, and silver are highly malleable, it becomes easier to increase the cross-sectional area of the first abutting portion of the joining portion formed by adhesional wetting, and thus, easier to achieve a more reliable connection between the first and second electrodes. Alternatively, the conductive particle can be an alloy containing indium, tin, gold, or silver and another metal, in terms of lowering costs and improving moldability. The conductive particle can be such an alloy having a lower melting point for achieving a more reliable connection between the first and second electrodes as described below.

The conductive material, in particular, preferably includes indium. In that case, indium can be included in the conductive particle as a simple substance, an oxide (e.g., $In_2O_3$), or an alloy with tin or another metal (e.g., InSn, InSnBi). Indium has a low melting point of 156.4° C. Therefore, including indium in the conductive particle makes it easier to lower the melting point of the conductive particle. As a result, heating temperature during thermocompression bonding can be kept low, and adverse effects such as deformation of the second circuit board, e.g., FPC, due to heat, can be suppressed. In view of the above, the melting point of the conductive particles is preferably 75° to 250° C. and further preferably 110° to 240° C.

As described above, the heating temperature (Ta) of the interconnecting material mixture during thermocompression bonding can be lower than the melting point of the conductive particles, or equal to or higher than the melting point of the conductive particles. When the heating temperature Ta is equal to or higher than the melting point of the conductive particles, thermocompression bonding is preferably stopped before the first electrode is immersionally wetted with the molten matter. This enables the first abutting portion between the conductive particle and the first electrode to be formed by adhesional wetting and not immersional wetting. In the above case, the heating temperature Ta is preferably 60° to 250° C. and further preferably 120° to 250° C.

The second electrode can all be an electrode formed of, for example, gold or copper. Such an electrode can comprise a base electrode including copper, for example, and a metal film including gold, for example, formed on a surface of the base electrode. A thickness of the base electrode is preferably 5 µm to 30 µm, and further preferably 8 µm to 12 µm. The width of the base electrode is preferably 25 µm to 50 µm. A thickness of the metal film is preferably 0.05 µm to 0.45 µm, and further preferably 0.2 µm to 0.4 µm.

Due to the second electrode having the base electrode of copper, the production cost for the circuit board interconnection structure can be reduced. Moreover, due to forming the thin metal film of gold on the surface of the base electrode, the surface of the second electrode can be prevented from becoming oxidized. Thus, it becomes easier to form a second abutting portion of the joining portion, which abuts the second electrode, by immersional wetting of the second electrode with the conductive material, even when the activating agent for addition to the interconnecting material mixture is reduced, or even when the heating temperature for the interconnecting material mixture for thermocompression bonding is set to a comparatively low temperature. Thus, the strength of the joining portion can be easily increased. Moreover, due to reducing the activating agent amount or lowering the heating temperature, it becomes easier to form the first abutting portion of the joining portion, which abuts the first electrode, by adhesional wetting. Note that the activating agent for addition to the interconnecting material mixture is for improving the wettability of the electrode surfaces by removing the metal oxide film on the electrode surfaces.

In addition to liquid crystal panels and liquid crystal driver ICs, various electronic components such as IC chips (bare chips), IC packages, electronic modules, and chip components can be mounted on the first and second circuit boards. The interconnecting material mixture may be in a film form, or in a paste or half-cured (B-stage) form.

A content of the conductive particles in the interconnecting material mixture is preferably in the range of 0.1 vol % to 10 vol %. Due to 0.1 vol % being the lower limit for the conductive particle content, poor electrical continuity can be prevented. On the other hand, due to 10 vol % being the upper limit for the conductive particle content, short circuit between the adjacent electrodes can be effectively prevented. A further preferable range for the conductive particle content is 0.1 vol % to 5 vol %. A particle size of the conductive particles can be, for example, 1 µm to 5 µm.

The interconnecting material mixture can include an inorganic filler, such as silica ($SiO_2$) or alumina, having an average particle size smaller than the conductive particles. Due to the interconnecting material mixture including the inorganic filler, the reinforcing resin portion including the inorganic filler can be formed. This enables the reinforcing resin portion to have a smaller coefficient of thermal expansion, and in contrast, a larger elastic modulus. As a result, deterioration of the reinforcing resin portion, such as occurrences of cracks therein, can be suppressed. Such cracks occur when the circuit board interconnection structure undergoes heat cycles in which the structure is heated and then cooled; or when an electronic device including the circuit board interconnection structure is dropped, causing impact on the reinforcing resin portion. Therefore, resistance of the joining portion against heat cycles as well as impacts can be improved. Moreover, since the moisture absorptivity of the reinforcing resin portion can be lowered, corrosion of the electrodes and the wirings can be prevented. Note that a content of the inorganic filler relative to the interconnecting material mixture as a whole including the inorganic filler is preferably 10 vol % to 50 vol %. In that case, a particle size Dk of the inorganic filler is preferably made smaller than the particle size of the conductive particles, and can be, for example, about $0.1\ \mu m \leq Dk \leq 2\ \mu m$.

(First Embodiment)

Figure 1:
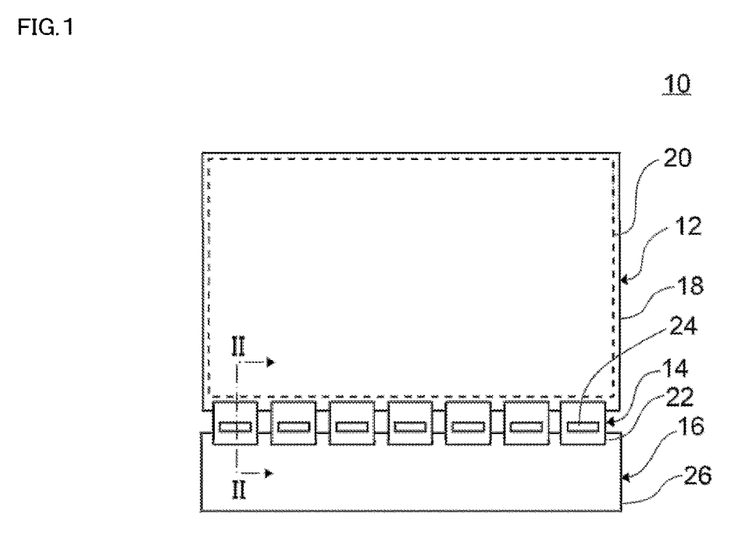
FIG. 1 A top view of an LCD including a circuit board interconnection structure according to an embodiment of the present invention FIG. 2 A sectional view of the LCD of FIG. 1 taken along the line II-II of FIG. 1
Figure 2:
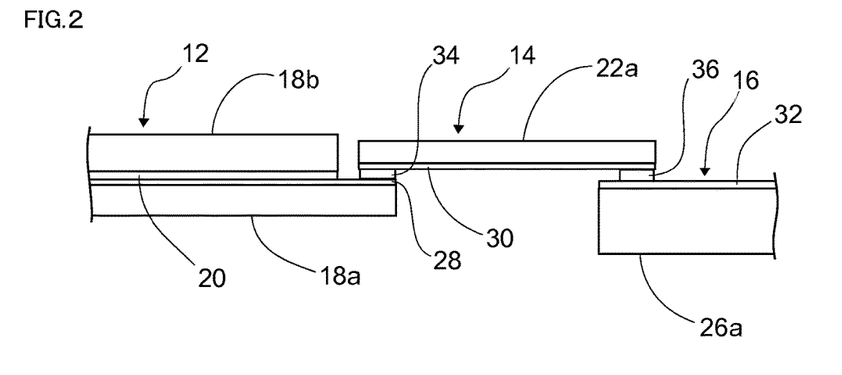
Figure 3:
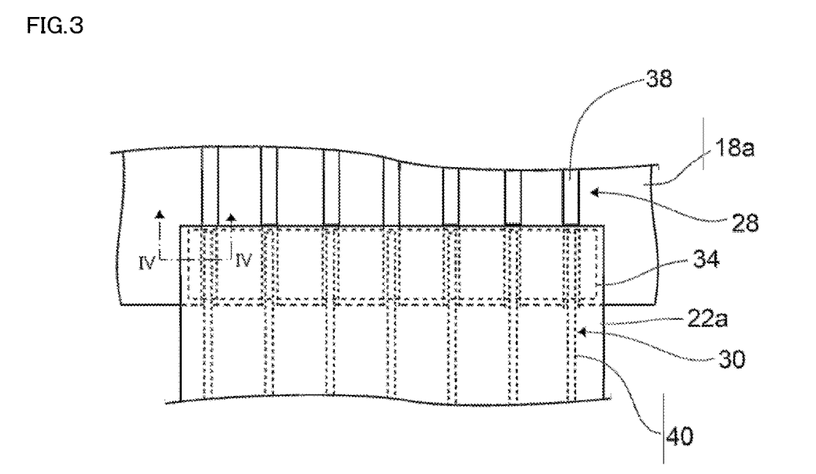
FIG. 3 A top view of an example of an area of connection between the first and second circuit boards FIG. 4 A sectional view of the example of the area of connection between the first and second circuit boards FIG. 5 A sectional view of the joining portion in detail FIG. 6 A sectional view of an example of the interconnecting material mixture FIG. 7 An illustration depicting a circuit board interconnection method according to an embodiment of the present invention, specifically depicting a state where the interconnecting material mixture is provided to the first electrode FIG. 8 An illustration depicting a circuit board interconnection method according to an embodiment of the present invention, specifically depicting a state prior to the joining of the first and second electrodes by thermocompression bonding FIG. 9 An illustration depicting a circuit board interconnection method according to an embodiment of the present invention, specifically depicting a state where thermocompression bonding is being conducted to join the first and second electrodes FIG. 10A An illustration depicting immersional wetting FIG. 10B An illustration depicting adhesional wetting FIG. 11A An illustration depicting a problem typical of the conventional technique FIG. 11B An illustration depicting another problem typical of the conventional technique

FIG. 1 is a plan view of a liquid crystal display (hereafter, referred to as LCD) to which the circuit board interconnection structure according to an embodiment of the present invention is applied. Note that the exterior housing of the LCD is omitted from the drawing. FIG. 2 is a cross sectional view of the LCD taken along the line II-II of FIG. 1. FIG. 3 is a plan view of a joining portion between a first module and a second module, enlarged.

In the illustrated example, the LCD 10 comprises: a first module (liquid crystal panel) 12; a plurality of (7 in the illustrated example) the second modules (driver circuit boards) 14 connected to the first module 12; and a third module 16 connected to the second modules 14.

The first module 12 includes a first circuit board 18 and a liquid crystal 20. The first circuit board 18 includes, for example, a transparent glass substrate (first substrate) 18a. The liquid crystal 20 interposed between alignment layers (not illustrated) is supported by the first circuit board 18. The first module 12 further includes a transparent second glass substrate 18b arranged such that it sandwiches the liquid crystal 20 with the first glass substrate 18a.

The second module 14 includes a second circuit board 22 and driver ICs 24 on the liquid crystal 20. The second circuit board 22 is a flexible printed circuit (FPC) including a second substrate 22a, e.g., a resin film. The driver ICs 24 are mounted on the second circuit board 22. A third module 16 includes a third circuit board 26 and a power supply control circuit (not illustrated). The third circuit board 26 is a printed circuit board (PCB) including a third substrate 26a, e.g., a rigid resin board. The power supply control circuit is mounted on the third circuit board 26, and controls power for driving the liquid crystal 20 and a backlight (not illustrated).

As illustrated in FIG. 2, the first circuit board 18 has a first wiring layer 28 disposed on an upper surface of the first glass substrate 18a (surface on the side of the liquid crystal 20). The second circuit board 22 has a second wiring layer 30 disposed on a lower surface of the second substrate 22a (surface facing the upper surface of the first glass substrate 18a). The third circuit board 26 has a third wiring layer 32 disposed on an upper surface of the third substrate 26a (surface facing the lower surface of the second substrate 22a). The first module 12, or specifically, the first circuit board 18 thereof, and the second module 14, or specifically, the second circuit board 22 thereof, are connected by a first connecting layer 34. The second module 14, or specifically, the second circuit board 22 thereof, and the third module 16, or specifically, the third circuit board 26 thereof, are connected by a second connecting layer 36. Note that the driver ICs 24 as well as the polarizing filter and other components typically included in a liquid crystal panel are not illustrated in FIG. 2.

As illustrated in FIG. 3, the first wiring layer 28 includes transparent first electrodes 38, i.e., ITO electrodes. The second wiring layer 30 includes second electrodes 40 corresponding to the first electrodes 38. The second electrodes 40 can each include a base electrode 40a (see FIG. 4) including copper, for example, and a thin metal film 40b including gold, for example. A thickness of the first electrode 38 is preferably 0.05 μm to 0.4 μm and further preferably 0.1 μm to 0.3 μm. A thickness of the base electrode 40a is preferably 5 μm to 30 μm and further preferably 8 μm to 12 μm. The width of the base electrode 40a is preferably 25 μm to 50 μm. A thickness of the thin metal film 40b is preferably 0.05 μm to 0.45 μm and further preferably 0.2 μm to 0.4 μm.

Figure 4:
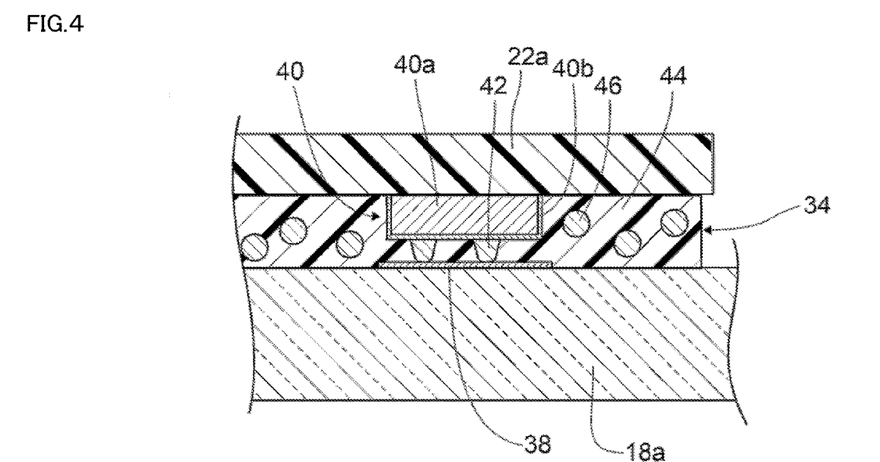

FIG. 4 is a sectional view of a relevant part of the structure of connection between the first module, i.e., the liquid crystal panel, and the second module, i.e., the driver circuit board, taken along the line IV-IV of FIG. 3. The first connecting layer 34 includes: one or more joining portions 42 formed of a metal-containing conductive material, for joining the first electrode 38 and the second electrode 40; a reinforcing resin portion 44 for reinforcing the joining portion 42; and a plurality of conductive particles 46 embedded in the reinforcing resin portion 44.

Figure 5:
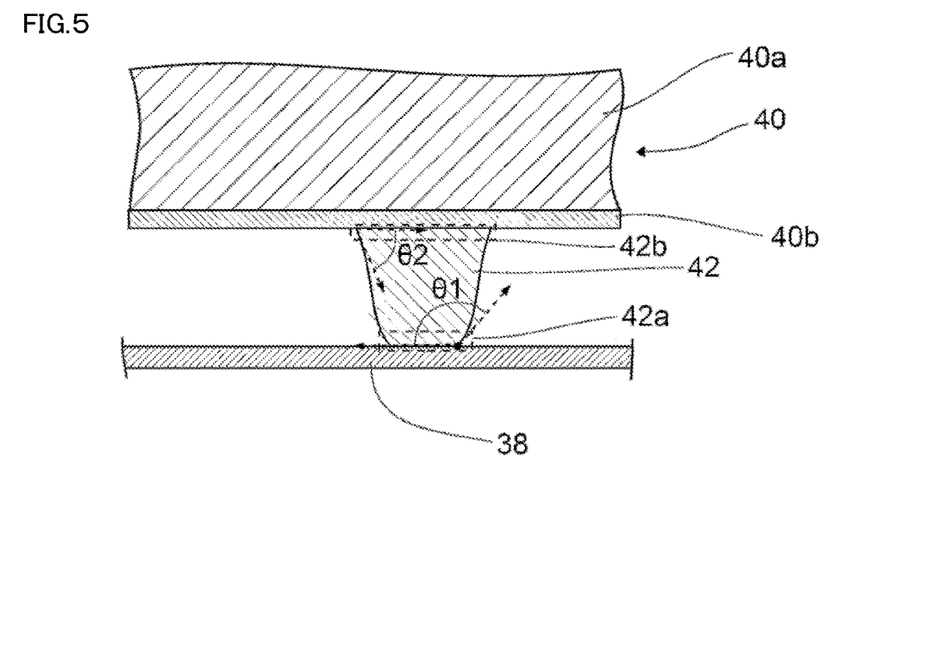

FIG. 5 is an enlarged view of the joining portion. At a first abutting portion 42a of the joining portion 42, which abuts the first electrode 38, i.e., the ITO electrode, a contact angle θ1 between the joining portion 42 and the first electrode 38 is greater than 90°. In contrast, at a second abutting portion 42b of the joining portion 42, which abuts the second electrode 40, a contact angle θ2 between the joining portion 42 and the second electrode 40 is smaller than 90°. The following gives a description of a circuit board interconnection method for forming the joining portion 42 as described above.

Figure 6:
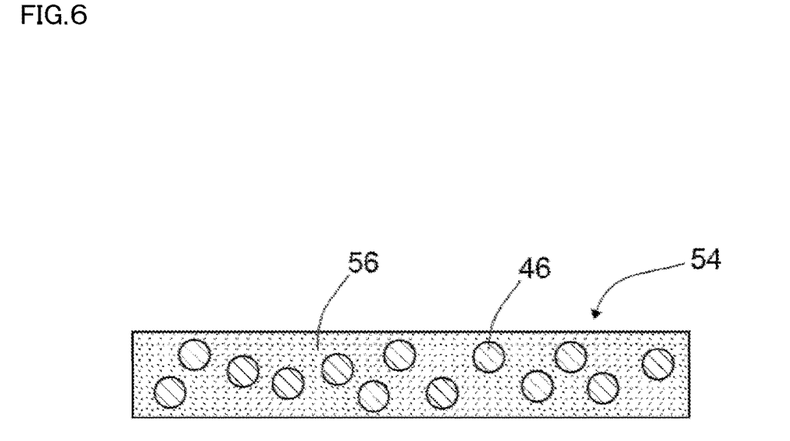

As illustrated in FIG. 6, an interconnecting material mixture 54 comprises: a reinforcing resin 56 including a thermoset resin and having fluidity; and the conductive particles 46 of a predetermined proportion mixed and dispersed therein. The interconnecting material mixture 54 may be in paste form, or molded into film form. Alternatively, the interconnecting material mixture 54 may be B-stage. B-stage means that the cross-linking reaction of the thermoset resin is in middle stage.

The reinforcing resin 56 can be prepared by mixing the thermoset resin with, for example, a curing agent, a thixotropic agent, a pigment, a coupling agent, and an activating agent. The glass transition temperature of the thermoset resin in a cured state is not particularly limited, but is preferably equal to a melting point of the conductive particles 46 or higher (e.g., 120° to 160°). The activating agent can be a material such as an organic acid or halide that is active in removing matters such as oxide from surfaces of the first and second electrodes when joining the conductive particles 46 and the first and second electrodes.

The thermoset resin to be included in the reinforcing resin 56 is not particularly limited, and examples thereof include epoxy resin, urethane resin, acryl resin, polyimide resin, polyamide resin, bismaleimide resin, phenol resin, polyester resin, silicone resin, and oxetane resin. These may be used singly, or in a combination of two or more. Among these, epoxy resin and acryl resin are particularly preferred due to their excellent heat resistance.

The epoxy resin is not particularly limited, but preferred are bisphenol A epoxy resin, bisphenol F epoxy resin, bisphenol S epoxy resin, biphenyl epoxy resin, naphthalene epoxy resin, phenol novolac epoxy resin, and cresol novolac epoxy resin. Modifications of the above resins can also be used. These may be used singly, or in a combination of two or more.

Examples of the curing agent to be used in combination with the above thermoset resin, include thiol compounds, modified amine compounds, polyfunctional phenol compounds, imidazole compounds, and acid anhydride compounds. These may be used singly, or in a combination of two or more.

The conductive particles 46 may comprise a simple substance of metal, a metal alloy, or an oxide. The metal is preferably In, Sn, Au, or Ag. The conductive particles 46 may comprise, for example, a simple substance of In, $In_2O_3$, InSn, or InSnBi. Alternatively, the conductive particles 46 may comprise a solder material such as a Sn—Bi alloy, a Sn—Ag—Cu alloy, a Sn—Bi—Ag alloy, a Sn—Cu alloy, a Sn—Sb alloy, a Sn—Ag alloy, a Sn—Ag—Cu—Bi alloy, a Sn—Ag—Bi—In alloy, a Sn—Ag—Cu—Sb alloy, a Sn—Zn alloy, or a Sn—Zn—Bi alloy. The conductive particles 46 preferably have a melting point of 110° to 240°.

Figure 7:
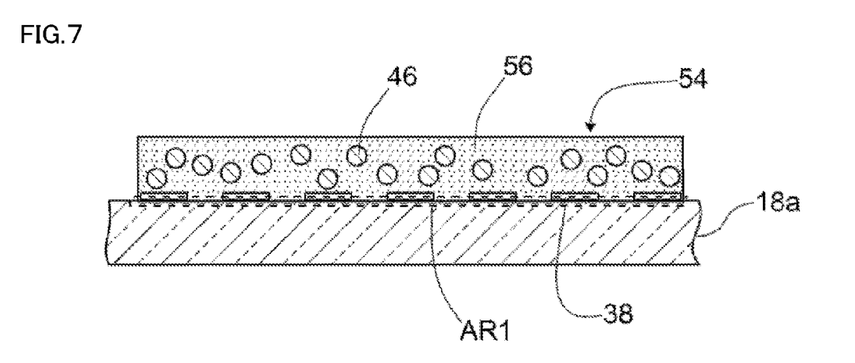
Figure 8:
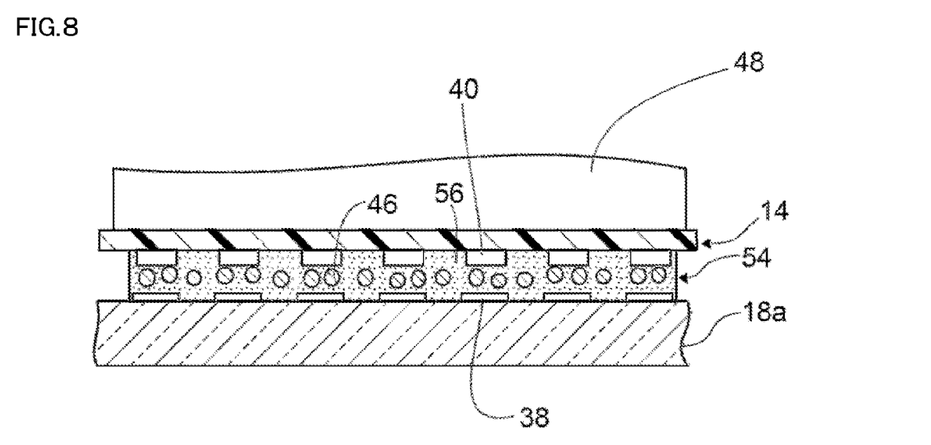

First, as illustrated in FIG. 7, the interconnecting material mixture 54 is supplied to an area AR1 on the first substrate 18a, where the first electrodes 38 are formed. Next, as illustrated in FIG. 8, the position of the second module 14 is adjusted such that the second electrodes 40 face their respective first electrodes 38. Thereafter, the second module 14 is attached to the interconnecting material mixture 54 supplied to the area AR1 (tentative compression).

Figure 9:
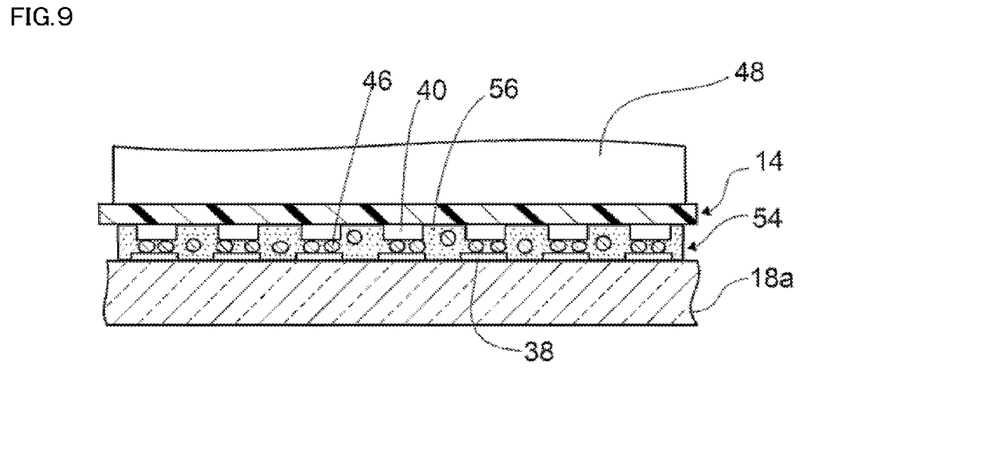

Then, as illustrated in FIG. 9, a heat bonding head 48 presses the second module 14 against the first glass substrate 18a of the first module 12, with a predetermined amount of pressure, thereby to bond the two modules together (actual compression). This enables one or more of the conductive particles 46 to be interposed between the second electrodes 40 and their respective first electrodes 38. Note that the heat bonding head 48 holds the second module 14, for example, by suction.

The state as illustrated in FIG. 9 is maintained for a predetermined heat bonding time Ma. At that time, a heat bonding temperature Ta and the heat bonding time Ma (e.g., 5 seconds) are set such that the reinforcing resin 56 thermally cures and the conductive particles 46 wet the second electrodes 40 by immersional or spreading wetting, and wet the first electrodes (38) by adhesional wetting and not immersional wetting.

Figure 10B:
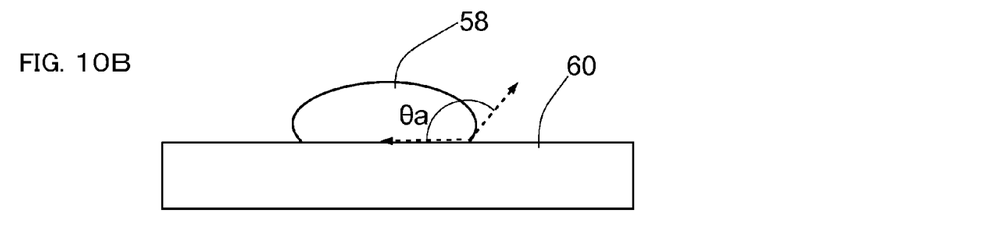

Immersional wetting, as illustrated in FIG. 10A, is when a fluid 58 on a surface of an object 60 bulges outward in lens form, and a contact angle θa between the fluid 58 and the surface of the object 60 is 0<θa≤90°. Adhesional wetting, as illustrated in FIG. 10B, is when the fluid 58 on the surface of the object 60 bulges outward in lens form, and the contact angle θa is 90°<θa. Spreading wetting is when the fluid 58 on the surface of the object 60 does not bulge outward in lens form, but spreads out instead.

As a result of the foregoing, the reinforcing resin 56 thermally cures; and as illustrated in FIG. 4, the reinforcing resin portion 44 is formed, while the conductive particles 46 interposed between the electrodes each become the joining portion 42. Thus, as illustrated in FIG. 5, the first abutting portion 42a of the joining portion 42, which abuts the first electrode 38, wets the first electrode (38) by adhesional wetting; whereas the second abutting portion 42b of the joining portion 42, which abuts the second electrode 40, wets the second electrode (40) by immersional wetting. That is, the contact angle between the joining portion 42 and the surface of the first electrode 38 is greater than 90°; whereas the contact angle between the joining portion 42 and the surface of the second electrode 40 is 90° or smaller.

Figure 11B:
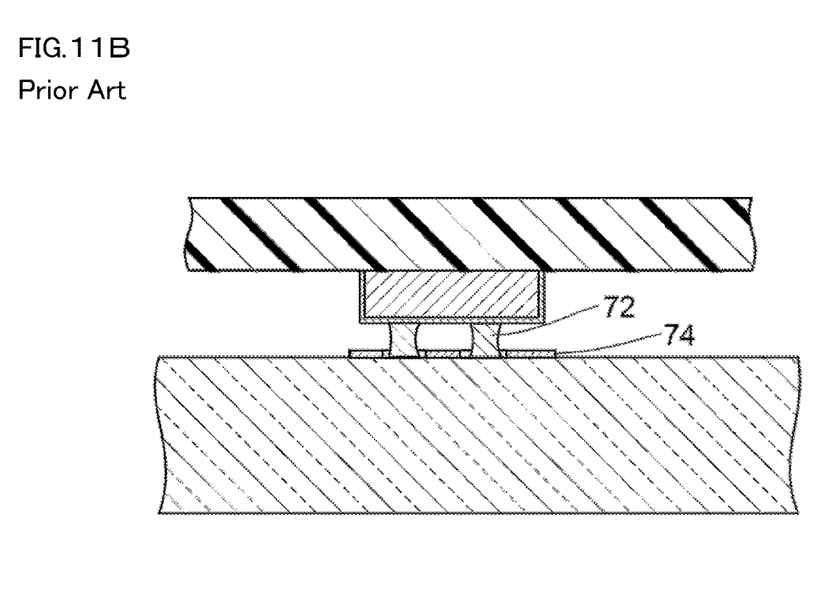

In that case, an alloy between the metal in the conductive particles 46 and a metal (e.g., Au) in the second electrode (40), i.e., the thin metal film 40b, is formed at the second abutting portion 42b of the joining portion 42. In contrast, formation of an alloy between the metal in the conductive particles 46 and a metal in the first electrode 38 is prevented at the first abutting portion 42a of the joining portion 42. As a result, corrosion of the first electrode caused due to the joining portion, as in the conventional technique as in FIG. 11B, is prevented. Thus, the first electrode 38 and the second electrode 40 can be joined with stability, via the joining portion 42 originating from the conductive particle 46. Therefore, the first and the second circuit boards can be interconnected with improved reliability.

In the foregoing, the present invention has been described in terms of one embodiment. However, the present invention is capable of various alterations and modifications. For example, the interconnecting material mixture may include an inorganic filler such as silica ($SiO_2$) or alumina.

INDUSTRIAL APPLICABILITY

The present invention enables a more reliable connection between a circuit board on which transparent conductive films are used as electrodes, and another electrode; and therefore, is suited for application in liquid crystal displays which include ITO electrodes.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

LIST OF REFERENCE NUMERALS

10 LCD device
12 first module (liquid crystal panel)
14 second module (driver circuit board)
16 third module
18 first circuit board
18a first glass substrate
18b second glass substrate
20 liquid crystal
22 second circuit board
22a second substrate
24 driver IC
26 third circuit board
26a third substrate
28 first wiring layer
30 second wiring layer
32 third wiring layer
34 first connecting layer
36 second connecting layer
38 first electrode
40 second electrode
42 joining portion
42a first abutting portion
42b second abutting portion
44 reinforcing resin portion
46 conductive particle
48 heat bonding head
54 interconnecting material mixture
56 interconnecting material mixture

The invention claimed is:

1. A circuit board interconnection structure comprising:
a first circuit board including a first substrate and a first electrode disposed on a surface of the first substrate;
a second circuit board including a second substrate and a second electrode disposed on a surface of the second substrate;
one or more joining portions composed of a metal-containing conductive material, comprising solder, for joining the first and second electrodes, interposed between the first and second electrodes; and
a reinforcing resin portion for reinforcing the one or more joining portions, the reinforcing resin portion including therein the one or more joining portions,
the first electrode being a transparent electrode including a metal oxide film,
a first abutting portion of the one or more joining portions abutting a surface of the metal oxide film of the first electrode facing the second electrode with a contact angle larger than 90°, and
a second abutting portion of the one or more joining portions abuts a surface of the second electrode facing the first electrode with a contact angle smaller than 90°.

2. The circuit board interconnection structure in accordance with claim 1,
wherein the metal oxide film includes at least one selected from the group consisting of an oxide containing indium and tin, an oxide containing gallium and zinc, and an oxide containing aluminum and zinc; and has a thickness of 0.05 µm to 0.4 µm, and
the metal oxide film is disposed directly on the surface of the first substrate.

3. The circuit board interconnection structure in accordance with claim 1,
wherein the conductive material includes at least one selected from the group consisting of indium, tin, gold, and silver.

4. The circuit board interconnection structure in accordance with claim 1,
wherein the first substrate includes a transparent substrate, and
the second substrate includes a resin film.

5. The circuit board interconnection structure in accordance with claim 1,
wherein the second electrode includes: a base electrode including copper; and a metal film including gold, disposed on a surface of the base electrode.

6. The circuit board interconnection structure in accordance with claim 5,
wherein the base electrode has a thickness of 5 µm to 30 µm, and
the metal film has a thickness of 0.05 µm to 0.45 µm.

7. The circuit board interconnection structure in accordance with claim 1,
wherein a ratio of a largest cross-sectional area of the one or more joining portions to a cross-sectional area of the first abutting portion is 1.1 to 4.

8. The circuit board interconnection structure in accordance with claim 1, wherein the conductive material includes a Sn—Bi alloy, a Sn—Ag—Cu alloy, a Sn—Bi—Ag alloy, a Sn—Cu alloy, a Sn—Sb alloy, a Sn—Ag alloy, a Sn—Ag—Cu—Bi alloy, a Sn—Ag—Bi—In alloy, a Sn—Ag—Cu—Sb alloy, a Sn—Zn alloy, or a Sn—Zn—Bi alloy.

9. The circuit board interconnection structure in accordance with claim 1, wherein the conductive material has a melting point of 110° C. to 240° C.

10. The circuit board interconnection structure in accordance with claim 1, further comprising:
metal-containing conductive particles comprising solder that is a same solder as in the one or more joining portions,
the metal-containing conductive particles being dispersed in the reinforcing resin portion and having a different shape from the one or more joining portions.

* * * * *